United States Patent
Kipnis et al.

(10) Patent No.: US 6,791,416 B2
(45) Date of Patent: Sep. 14, 2004

(54) VARIABLE GAIN AMPLIFIER WITH ADJUSTABLE GAIN SLOPE

(75) Inventors: Issy Kipnis, Berkeley, CA (US); Yong Chin Kong, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 61 days.

(21) Appl. No.: 10/271,376

(22) Filed: Oct. 15, 2002

(65) Prior Publication Data

US 2004/0070452 A1 Apr. 15, 2004

(51) Int. Cl.$^7$ .................................................. H03G 3/30
(52) U.S. Cl. ..................................... 330/278; 330/279
(58) Field of Search .............................. 330/129, 134, 330/278, 279, 289

(56) References Cited

U.S. PATENT DOCUMENTS 4,677,390 A * 6/1987 Wagner .................. 330/278 X

FOREIGN PATENT DOCUMENTS

EP          1089430 A2     4/2001

* cited by examiner

Primary Examiner—Steven J. Mottola

(57) ABSTRACT

A variable gain amplifier has a gain control circuit. The gain control circuit includes a first control input and a second control input. The first control input receives a first control signal. The gain control circuit varies gain of the variable gain amplifier based on a value of the first control signal. The second control input receives a second control signal. The gain control circuit varies gain slope of the variable gain amplifier based on a value of the second control signal.

4 Claims, 4 Drawing Sheets

VARIABLE GAIN AMPLIFIER WITH ADJUSTABLE GAIN SLOPE

BACKGROUND

The present invention pertains to variable gain amplifiers and pertains particularly to a variable gain amplifier with adjustable gain slope.

Signals with a wide range of amplitudes, such as with audio amplification, often require amplifiers with a log-linear or a compression-type response. For example, high quality audio may have a range of 64,000 to 1 or greater, representing a range of 1 millivolt to 64 volts. For many amplifiers 1 millivolt is too noisy, and 64 volts is too high a voltage level. A compression amplifier, for the same range, typically has a much smaller and therefore more manageable set of operating voltages. However, compression type amplifiers have a gain that varies with amplitude, and the output may contain substantial distortion products. Many applications are adversely affected by this distortion, which can be shown to be due to large amounts of harmonics introduced in the process of compressing the signal.

A decibel (dB)-linear amplifier can achieve substantially the same result with much less harmonics by varying the gain as a function of an externally introduced control signal. However, forming a dB-linear amplifier requires that the compression products be separated from the linear signal being amplified. Attempts to solve this problem have been made many times. In one approach dB-linear amplifiers are realized with piecewise-linear approximation techniques. The output of the amplifier is controlled by, for example, feedback that varies with operating point. As the control voltage increases the amplifier gain decreases with an approximate fit to a log-linear curve, e. g., an exponential or square law curve. This provides fairly good operation, but to prevent distortion many steps in the piecewise-linear approximation are required, and the complexity and cost of implementation becomes quite large. This is because the approach approximates a smooth exponential waveform with a series of straight lines, and to gain relative smoothness in the output of the amplifier there must be many small lines.

It is also known that a semiconductor diode exhibits a log-linear response (the natural log), but the range is set by the diode characteristics, which vary with temperature and have an offset that may be difficult to compensate for. Additionally, the same problem of simultaneously varying the gain and the amplitude of the input, forming cross products, still exists. Log-linear amplifiers built with this principle have been reported to be linear and well behaved over more than six decades of operating range, but they are difficult to use due to their characteristics. In fact, piece-wise linear amplifiers are often preferred to avoid the problems with diode log-linear amplifiers.

All semiconductors are temperature sensitive. A technique commonly used in band gap regulators and similar circuits allows the temperature sensitivity to be adjusted, but for the prior art dB-linear amplifiers, the adjustment is performed in a separate step or module, which can lead to multiplying errors between the modules. One approach is to make a temperature stable separate amplifier and apply it to a piece-wise linear amplifier. This further increases the cost and complexity of the amplifier.

SUMMARY OF THE INVENTION

In accordance with a preferred embodiment of the present invention, a variable gain amplifier has a gain control circuit. The gain control circuit includes a first control input and a second control input. The first control input receives a first control signal. The gain control circuit varies gain of the variable gain amplifier based on a value of the first control signal. The second control input receives a second control signal. The gain control circuit varies gain slope of the variable gain amplifier based on a value of the second control signal.

DESCRIPTION OF THE PREFERRED EMBODIMENT

Figure 1:
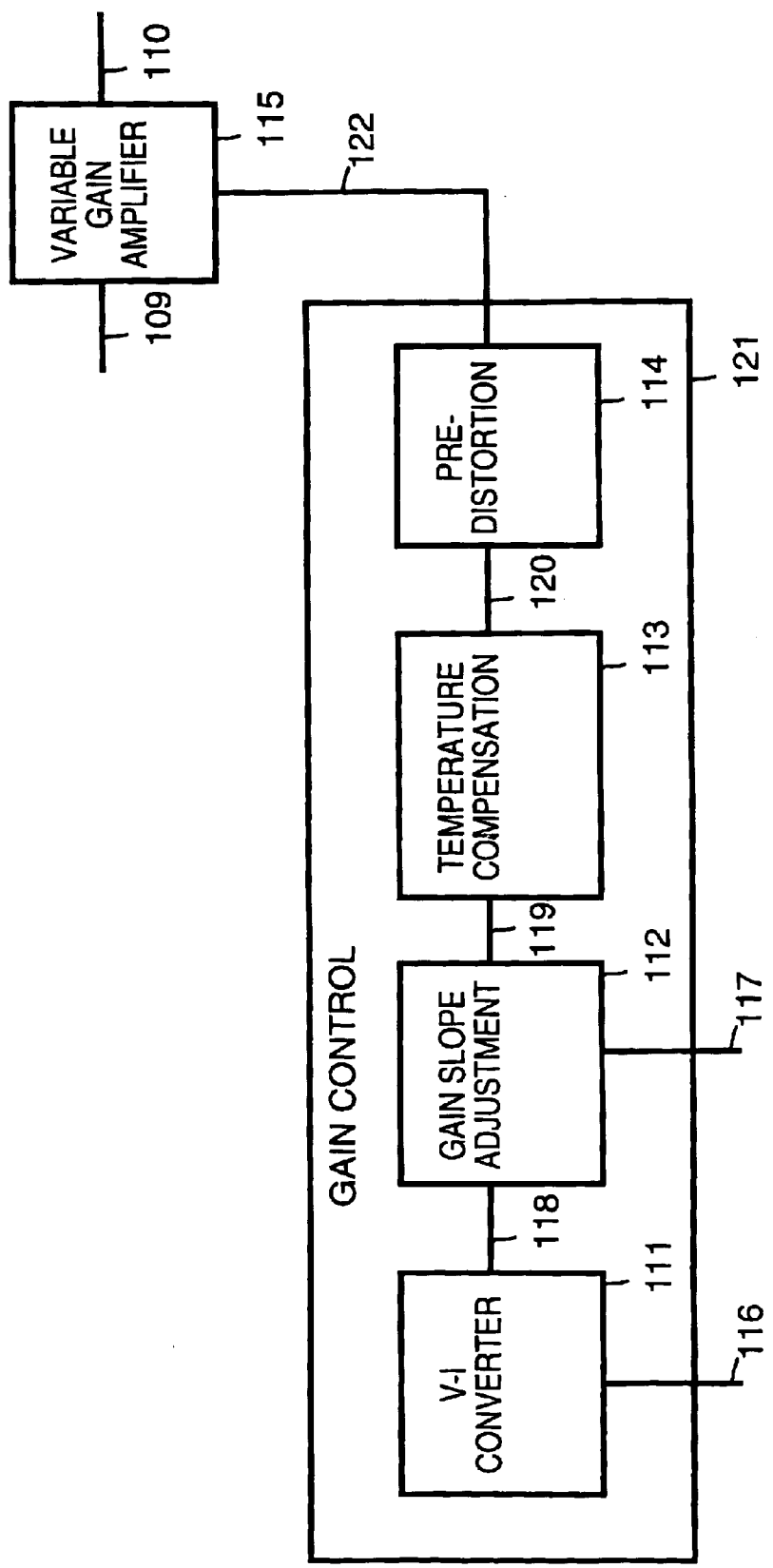
FIG. 1 is a simplified block diagram of a variable gain amplifier having a gain control circuit in accordance with a preferred embodiment of the present invention.

FIG. 1 is a simplified block diagram of a variable gain amplifier 115 having a gain control circuit 121. Gain control circuit 121 includes four functional blocks. A voltage to current (V-I) converter block converts a control voltage ($V_C$) placed on an input 116 to a current ($I_1$) forwarded on a line 118 to a gain slope adjustment block 112.

Gain slope adjustment block 112 varies the gain slope of the current ($I_1$) to produce a current ($I_1$) placed on a line 119. Gain slope of the current ($I_2$) is varied based on a control voltage ($V_{REF}$) placed on an input 117 of gain slope adjustment block 112.

A temperature compensation block 113, receives current ($I_2$) and proportional to temperature adjusts the value of current ($I_2$) to produce a current ($I_3$) placed on a line 120. A predistortion block 114 produces current ($I_4$) that varies exponentially with respect to current ($I_3$). Current ($I_4$) is placed on an input 122 to variable gain amplifier 115. Current ($I_4$) is fed into variable gain amplifier block 115 for gain adjustment. In the preferred embodiment, input 122 is a differential input that includes an additional current from predistortion block 114.

An input signal ($V_1$) is placed on an input 109 of variable gain amplifier 115. An output signal ($V_O$) is generated by gain amplifier on an output 110. The gain ($V_O/V_1$) of variable gain amplifier 115 varies linearly in decibels with respect to the control voltage ($V_C$), is stable over temperature variation, and has a gain slope adjustable by control voltage ($V_{REF}$). The dynamic range of variable gain amplifier 115 remains the same regardless of the slope of the gain produced.

Figure 2:
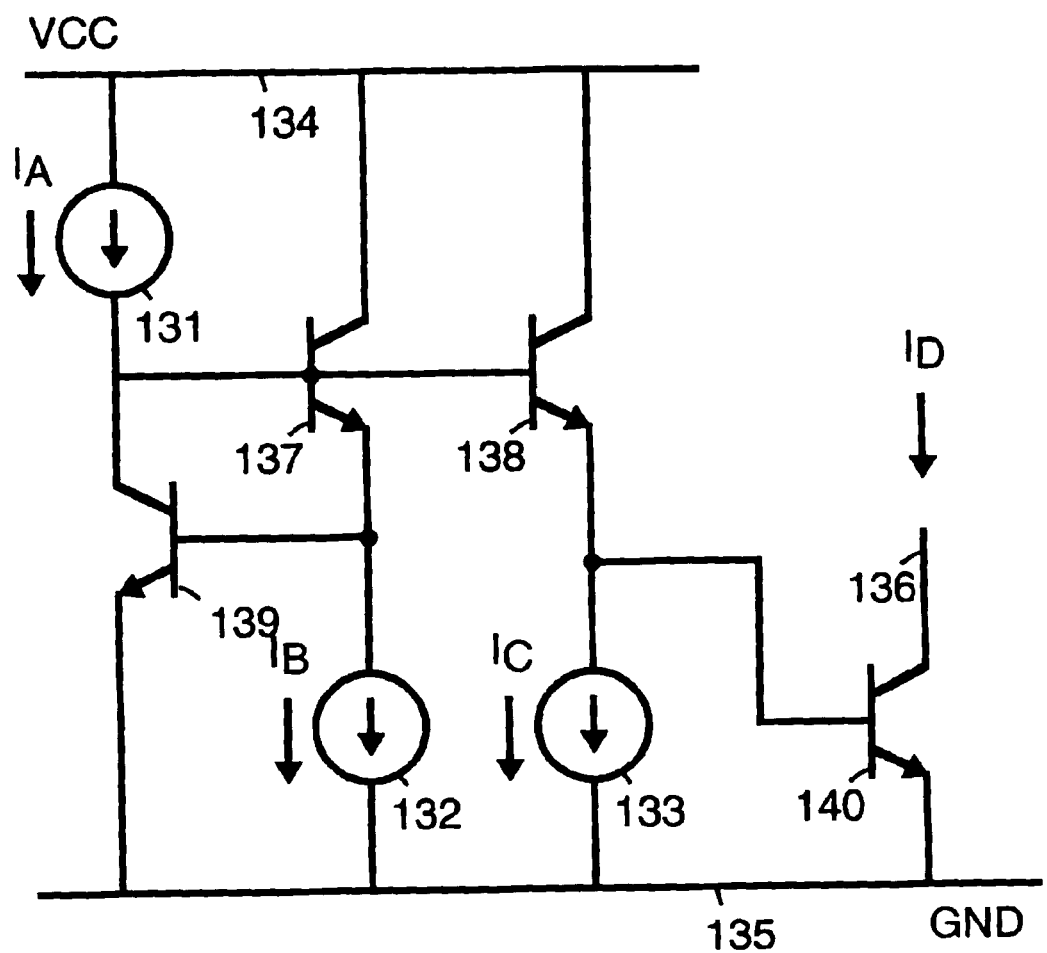
FIG. 2 is a simplified block diagram of a gain slope adjustment block that is part of the gain control circuit of the variable gain amplifier shown in FIG. 1 in accordance with a preferred embodiment of the present invention.

FIG. 2 is a simplified block diagram of gain slope adjustment block 112. The simplified block diagram includes a current ($I_A$) source 131, a current ($I_B$) source 132, a current ($I_C$) source 133, a bipolar npn transistor 137, a bipolar npn transistor 138, a bipolar npn transistor 139 and a bipolar npn transistor 140 connected as shown between a collector voltage supply (VCC) 134 and a ground 135. Gain slope adjustment block 112 produces a current ($I_D$) on a line 136. Output current ($I_2$) of variable gain amplifier shown in FIG. 1 is represented in FIG. 2 by current ($I_D$) of gain slope adjustment block 112. Current ($I_1$) of variable gain amplifier shown in FIG. 1 is represented in FIG. 2 by input current ($I_A$) of gain slope adjustment block 112. Alternatively, Current ($I_1$) of variable gain amplifier shown in FIG. 1 is represented in FIG. 2 by input current ($I_B$) of gain slope adjustment block 112. Current ($I_C$) is used as a control current. In order to implement the variable gain amplifier shown in FIG. 1, a voltage to current (V-I) converter is included within current source 133 to convert control voltage ($V_{REF}$) placed on input 117 (shown in FIG. 1) to control current ($I_C$) produced by current source 133.

Current ($I_D$) varies proportionally with current ($I_A$) and current ($I_B$). Current ($I_D$) varies inversely proportional to current ($I_C$). When transistor 137 and transistor 138 have similar characteristics and transistor 139 and transistor 140 have similar characteristics, the relationship between, current ($I_A$), current ($I_B$), current ($I_C$) and current ($I_D$) can be approximated by equation 1 below:

$$I_A I_B = I_C I_D \qquad \text{Equation 1}$$

Figure 3:
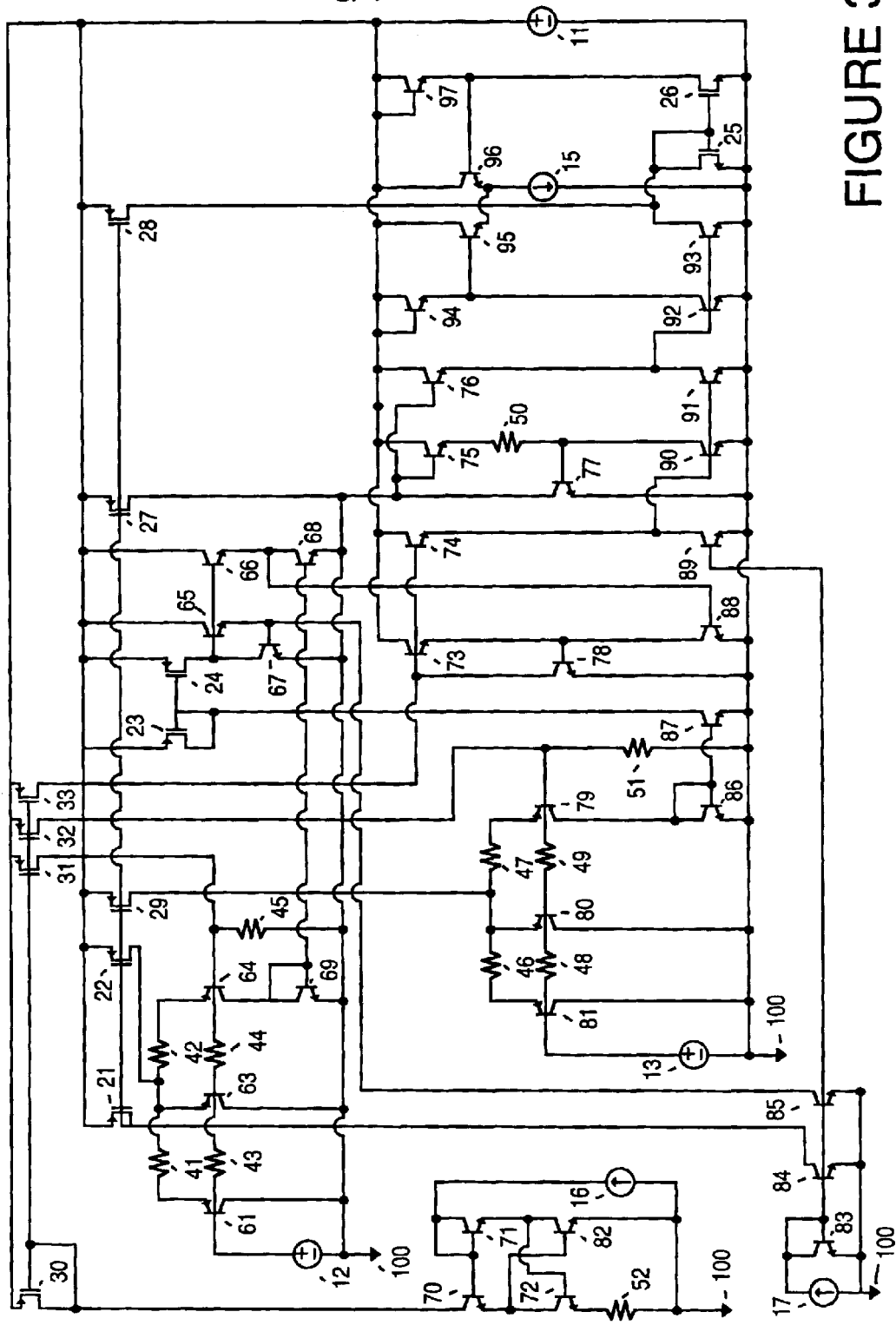
FIG. 3 is a schematic of the gain control circuit of the variable gain amplifier shown in FIG. 1 in accordance with a preferred embodiment of the present invention.

FIG. 3 is a schematic of gain control circuit 121. Gain control circuit 121 includes a VCC voltage source 11, a control voltage ($V_{REF}$) 12 for adjusting gain slope, a control voltage ($V_C$) 13 which is converted to a control current, a current source 15, a current source 16, a current source 17, a field-effect transistor (FET) 21, an FET 22, an FET 23, an FET 24, an FET 25, an FET 26, an FET 27, an FET 28, an FET 29, an FET 30, an FET 31, an FET 32, an FET 33, a resistor 41, a resistor 42, a resistor 43, a resistor 44, a resistor 45, a resistor 46, a resistor 47, a resistor 48, a resistor 49, a resistor 50, a resistor 51, a resistor 52, a bi-polar transistor 61, a bi-polar transistor 63, a bi-polar transistor 64, a bi-polar transistor 65, a bi-polar transistor 66, a bi-polar transistor 67, a bi-polar transistor 68, a bi-polar transistor 69, a bi-polar transistor 70, a bi-polar transistor 71, a bi-polar transistor 72, a bi-polar transistor 73, a bi-polar transistor 74, a bi-polar transistor 75, a bi-polar transistor 76, a bi-polar transistor 77, a bi-polar transistor 78, a bi-polar transistor 79, a bi-polar transistor 80, a bi-polar transistor 81, a bi-polar transistor 82, a bi-polar transistor 83, a bi-polar transistor 84, a bi-polar transistor 85, a bi-polar transistor 86, a bi-polar transistor 87, a bi-polar transistor 88, a bi-polar transistor 89, a bi-polar transistor 90, a bi-polar transistor 91, a bi-polar transistor 92, a bi-polar transistor 93, a bi-polar transistor 94, a bi-polar transistor 95, a bi-polar transistor 96, a bi-polar transistor 97 and a ground 100, connected as shown. Current source 16 represents an enable input. Current source 17 also can be used to enable/disable gain control circuit 121. Current source 15 is used as a biasing current for variable gain amplifier 115.

In FIG. 3, the gain slope adjustment block is implemented by transistor 67, transistor 65, transistor 66, transistor 88, FET 23 and FET 24. A voltage to current (V-I) converter used to convert control voltage ($V_C$) 13 to a current ($I_1$) that varies the gain of the variable gain amplifier is implemented by a transistor 81, transistor 80, transistor 79, transistor 86, transistor 87 and resistors 46 through 49 and 51. A voltage to current (V-I) converter used to convert control voltage ($V_{REF}$) 12 to a current that controls the gain slope adjustment block includes a transistor 61, transistor 63, transistor 64, transistor 69, transistor 68 and resistors 41 through 45. Transistors 78, 73, 74, 90 and 91 are used for temperature compensation. Predistortion block 114 (shown in FIG. 1) is implemented by transistors 77, 75, 76, 94, 92, 93 and 97, resistor 50 and FETs 25 and 26 shown in FIG. 3. The differential input to variable gain amplifier 115 (shown in FIG. 1), is provided by the current between transistor 94 and transistor 92 and by the current between transistor 97 and FET 26.

Figure 4:
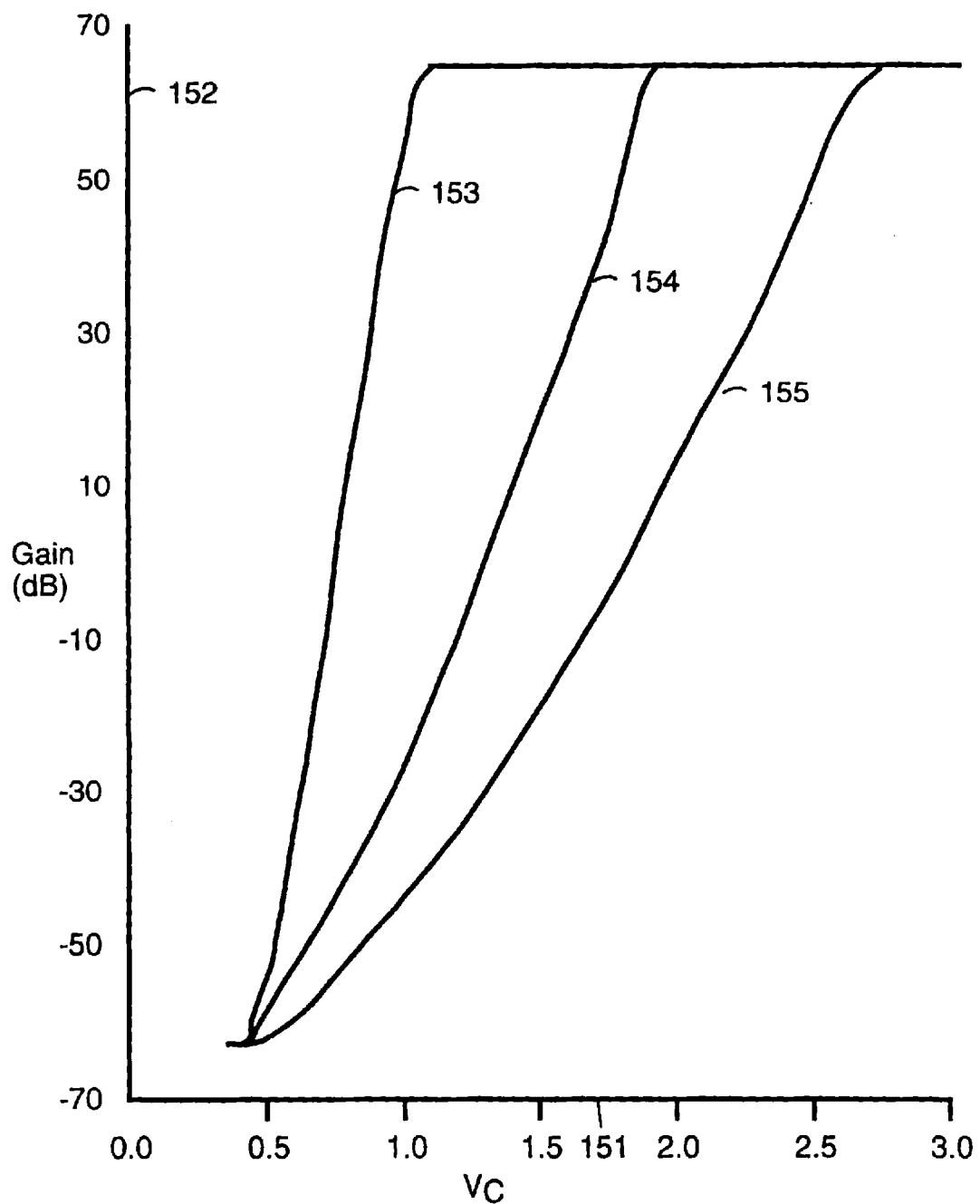
FIG. 4 shows response of the variable gain amplifier with gain slope adjustment shown in FIG. 3 in accordance with a preferred embodiment of the present invention.

FIG. 4 shows response of the variable gain amplifier with gain slope adjustment shown in FIG. 3. A horizontal axis 151 represents the value of control voltage ($V_C$) 13. A vertical axis 152 represents output gain of the variable gain amplifier. A trace 153 represents gain of the variable gain amplifier when control voltage ($V_{REF}$) 13 is set at 2 volts. A trace 154 represents gain of the variable gain amplifier when control voltage ($V_{REF}$) 13 is set at 2.5 volts. A trace 155 represents gain of the variable gain amplifier when control voltage ($V_{REF}$) 13 is set at 3 volts.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A variable gain amplifier having a gain control circuit, the gain control circuit comprising:

a first control input that receives a first control signal, the gain control circuit varying gain of the variable gain amplifier based on a value of the first control signal; and, a second control input that receives a second control signal, the gain control circuit varying gain slope of the variable gain amplifier based on a value of the second control signal;

wherein the gain control circuit additionally comprises gain slope adjustment circuitry, the gain slope adjustment circuitry receiving the second control signal and based on the second control signal varying gain slope of the variable gain amplifier, the gain slope adjustment circuitry comprising:

a first transistor having an emitter, a collector and a base, the emitter of the first transistor being connected to a ground;

an input current source connected between the collector of the first transistor and a collector voltage source (VCC);

a second transistor having an emitter, a collector and a base, the collector of the second transistor being connected to the VCC, the base of the second transistor being connected to the collector of the first transistor and the emitter of the second transistor being connected to the base of the first transistor;

an additional current source connected between the emitter of the second transistor and the ground;

a third transistor having an emitter, a collector and a base, the collector of the third transistor being connected to the VCC, and the base of the third transistor being connected to the collector of the first transistor;

a control current source connected between the emitter of the third transistor and the ground; and, a fourth transistor having an emitter, a collector and a base, the emitter of the fourth transistor being connected to the ground, the base of the fourth transistor being connected to the emitter of the third transistor, an output current for the gain slope adjustment circuitry being drawn by the collector of the fourth transmitter.

2. A variable gain amplifier having a gain control circuit, the gain control circuit comprising:

a first control input that receives a first control signal, the gain control circuit varying gain of the variable gain amplifier based on a value of the first control signal; and, a second control input that receives a second control signal, the gain control circuit varying gain slope of the variable gain amplifier based on a value of the second control signal;

wherein the gain control circuit additionally comprises gain slope adjustment circuitry, the gain slope adjustment circuitry receiving the second control signal and based on the second control signal varying gain slope of the variable gain amplifier, the gain slope adjustment circuitry comprising:

a first transistor having an emitter, a collector and a base, the emitter of the first transistor being connected to a ground;

a current source connected between the collector of the first transistor and a collector voltage source (VCC);

a second transistor having an emitter, a collector and a base, the collector of the second transistor being connected to the VCC, the base of the second transistor being connected to the collector of the first transistor and the emitter of the second transistor being connected to the base of the first transistor;

an input current source connected between the emitter of the second transistor and the ground;

a third transistor having an emitter, a collector and a base, the collector of the third transistor being connected to the VCC, and the base of the third transistor being connected to the collector of the first transistor;

a control current source connected between the emitter of the third transistor and the ground; and, a fourth transistor having an emitter, a collector and a base, the emitter of the fourth transistor being connected to the ground, the base of the fourth transistor being connected to the emitter of the third transistor, an output current for the gain slope adjustment circuitry being drawn by the collector of the fourth transmitter.

3. A gain control circuit for use with a variable gain amplifier, the gain control circuit comprising:

a first control input for receiving a first control signal, the gain control circuit varying gain of the variable gain amplifier based on a value of the first control signal;

a second control input for receiving a second control signal, the gain control circuit varying gain slope of the variable gain amplifier based on a value of the second control signal; and, gain slope adjustment circuitry, the gain slope adjustment circuitry receiving the second control signal and based on the second control signal varying gain slope of the variable gain amplifier, the gain slope adjustment circuitry comprising:

a first transistor having an emitter, a collector and a base, the emitter of the first transistor being connected to a ground, an input current source connected between the collector of the first transistor and a collector voltage source (VCC), a second transistor having an emitter, a collector and a base, the collector of the second transistor being connected to the VCC, the base of the second transistor being connected to the collector of the first transistor and the emitter of the second transistor being connected to the base of the first transistor, an additional current source connected between the emitter of the second transistor and the ground, a third transistor having an emitter, a collector and a base, the collector of the third transistor being connected to the VCC, and the base of the third transistor being connected to the collector of the first transistors, a control current source connected between the emitter of the third transistor and the ground, and a fourth transistor having an emitter, a collector and a base, the emitter of the fourth transistor being connected to the ground, the base of the fourth transistor being connected to the emitter of the third transistor, an output current for the gain slope adjustment circuitry being drawn by the collector of the fourth transmitter.

4. A gain control circuit for use with a variable gain amplifier, the gain control circuit comprising:

a first control input for receiving a first control signal, the gain control circuit varying gain of the variable gain amplifier based on a value of the first control signal;

a second control input for receiving a second control signal, the gain control circuit varying gain slope of the variable gain amplifier based on a value of the second control signal; and, gain slope adjustment circuitry, the gain slope adjustment circuitry receiving the second control signal and based on the second control signal varying gain slope of the variable gain amplifier, the gain slope adjustment circuitry comprising:

a first transistor having an emitter, a collector and a base, the emitter of the first transistor being connected to a ground;

a current source connected between the collector of the first transistor and a collector voltage source (VCC), a second transistor having an emitter, a collector and a base, the collector of the second transistor being connected to the VCC, the base of the second transistor being connected to the collector of the first transistor and the emitter of the second transistor being connected to the base of the first transistor, an input current source connected between the emitter of the second transistor and the ground, a third transistor having an emitter, a collector and a base, the collector of the third transistor being connected to the VCC, and the base of the third transistor being connected to the collector of the first transistor, a control current source connected between the emitter of the third transistor and the ground, and a fourth transistor having an emitter, a collector and a base, the emitter of the fourth transistor being connected to the ground, the base of the fourth transistor being connected to the emitter of the third transistor, an output current for the gain slope adjustment circuitry being drawn by the collector of the fourth transmitter.

* * * * *